United States Patent
Smith et al.

(10) Patent No.: US 7,471,988 B2
(45) Date of Patent: Dec. 30, 2008

(54) METHOD AND APPARATUS FOR AUTOMATIC EQUALIZATION MODE ACTIVATION

(75) Inventors: Margaret Paige Smith, Indianapolis, IN (US); Lisa Renee Johnson, Indianapolis, IN (US); Sin Hui Cheah, Carmel, IN (US)

(73) Assignee: Thomas Licensing, Boulogne Billancourt (FR)

( * ) Notice: Subject to any disclaimer, the term of this patent is extended or adjusted under 35 U.S.C. 154(b) by 794 days.

(21) Appl. No.: 10/489,211

(22) PCT Filed: Jun. 28, 2002

(86) PCT No.: PCT/US02/20365

§ 371 (c)(1),
(2), (4) Date: Mar. 10, 2004

(87) PCT Pub. No.: WO03/023786

PCT Pub. Date: Mar. 20, 2003

(65) Prior Publication Data

US 2004/0237750 A1    Dec. 2, 2004

Related U.S. Application Data

(60) Provisional application No. 60/318,585, filed on Sep. 11, 2001.

(51) Int. Cl.
*G06F 17/00* (2006.01)

(52) U.S. Cl. .......................... 700/94; 381/77

(58) Field of Classification Search .................. 700/94
See application file for complete search history.

(56) References Cited

U.S. PATENT DOCUMENTS 5,001,619 A    3/1991    Nakajima et al.

(Continued)

FOREIGN PATENT DOCUMENTS

EP    0982732    3/2000

(Continued)

OTHER PUBLICATIONS

WinSite Featured Software, WinSite website. [online] [retrieved on Jun. 10, 2007]. Retrieved from: <http://www.winsite.com/bin/Info?500000015765>.*

(Continued)

*Primary Examiner*—Walter F Briney, III
(74) *Attorney, Agent, or Firm*—Joseph J. Laks; Paul P. Kiel

(57) ABSTRACT

A digital audio player and a method for processing encoded digital audio data, wherein the digital audio data is encoded using one of a plurality of encoding formats. The exemplary audio data player includes a hard disk or other data storage medium for storing data files, a microcontroller, buffer memory for anti-skip protection, and an audio decoder. The encoded audio data files and associated decoder files are downloaded from a personal computer or similar device to the audio data player hard drive. The player provides a menu-driven user interface for selection, sorting, and playback of stored audio data files. The audio decoder, generally a digital signal processor, provides various preset equalization modes. The preset modes are specific to audio genres such as jazz, pop, and rock. The user may select a specific equalization mode by using the user interface, or the preset equalization mode will be automatically set based on the genre, or other attribute information, included in a tag portion of the audio data file.

15 Claims, 6 Drawing Sheets

U.S. PATENT DOCUMENTS

2001/0010633 A1 8/2001 Nakazawa et al.
2001/0010663 A1 8/2001 Nakazawa et al. ............. 369/2

FOREIGN PATENT DOCUMENTS

| EP | 1005252 | 5/2000 |
| JP | 11-052969 | 2/1999 |
| JP | 2011-005497 | 1/2001 |
| JP | 2001-67100 | 3/2001 |
| WO | 00/55853 | 9/2000 |

OTHER PUBLICATIONS

Jet-Audio version 4.6 screenshots. [screenshots generated on Jun. 10, 2007] [Jet-Audio downloaded Jun. 10, 2007]. Jet-Audio downloaded from: <http://www.dataxprs.com.eg/ftp/audio/Jukebox.html>. Four screenshots.* iTunes—Wikipedia [online] [retrieved Nov. 24, 2007] <URL:http://en.wikipedia.org/wiki/itunes>.*

Doug's AppleScripts for iTunes [online] [retrieved Nov. 10, 2007] [archived Feb. 4, 2002] <URL:http://web.archive.org/web/20020204043954/www.malcolmadams.com/itunes/itinfo/eqandvolume.html>.*

Jetaudio, Online XP002236662; Retrieved from the Internet: URL:http://www.jetaudio.com/products/jetaudio/features-v46.html, Mar. 31, 2003.

Shareware Viking, Online XP002236663, Retrieved from the Internet: URL:http://www.sharewareviking.com/multimedia4.htm, Mar. 31, 2003.

Search Report dated Mar. 31, 2003.

* cited by examiner

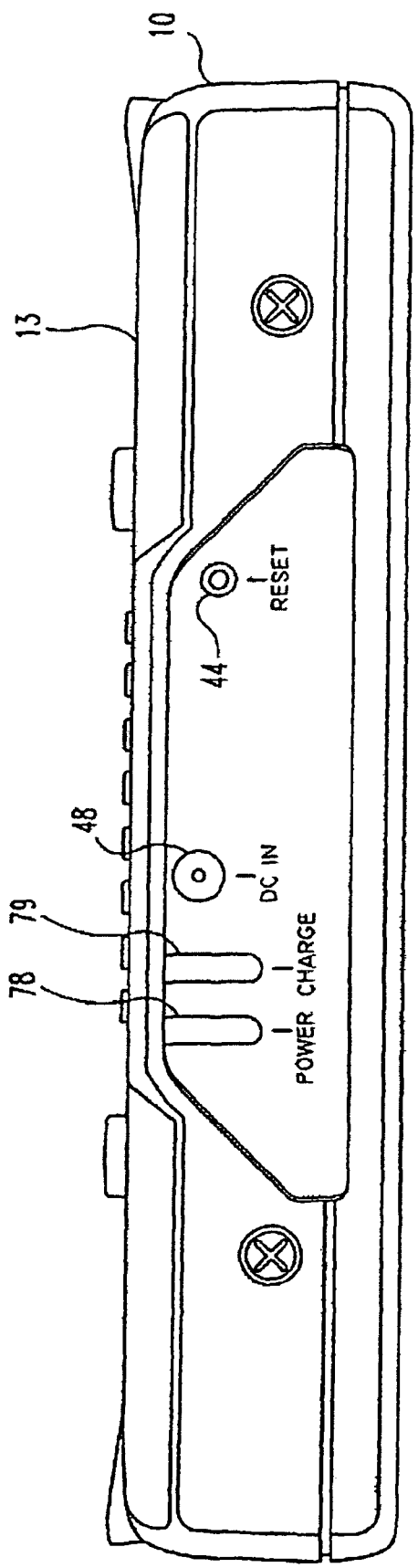
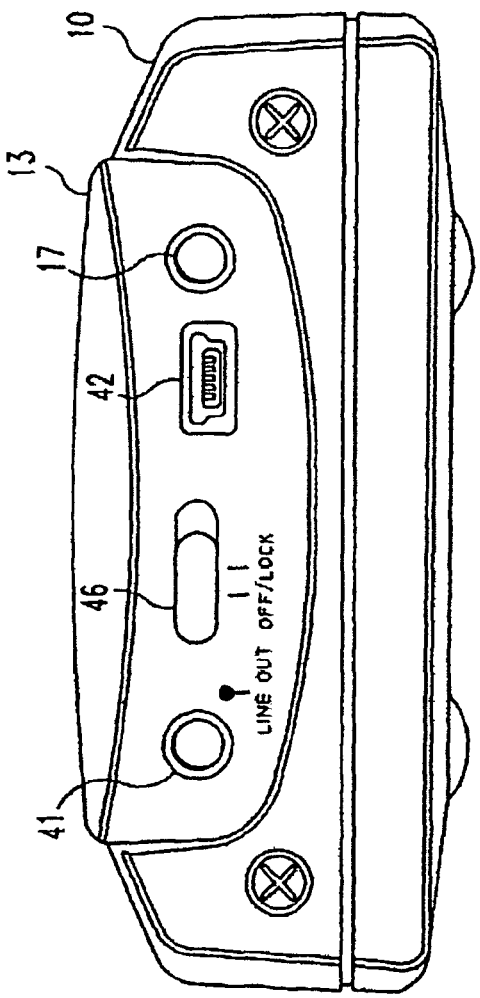

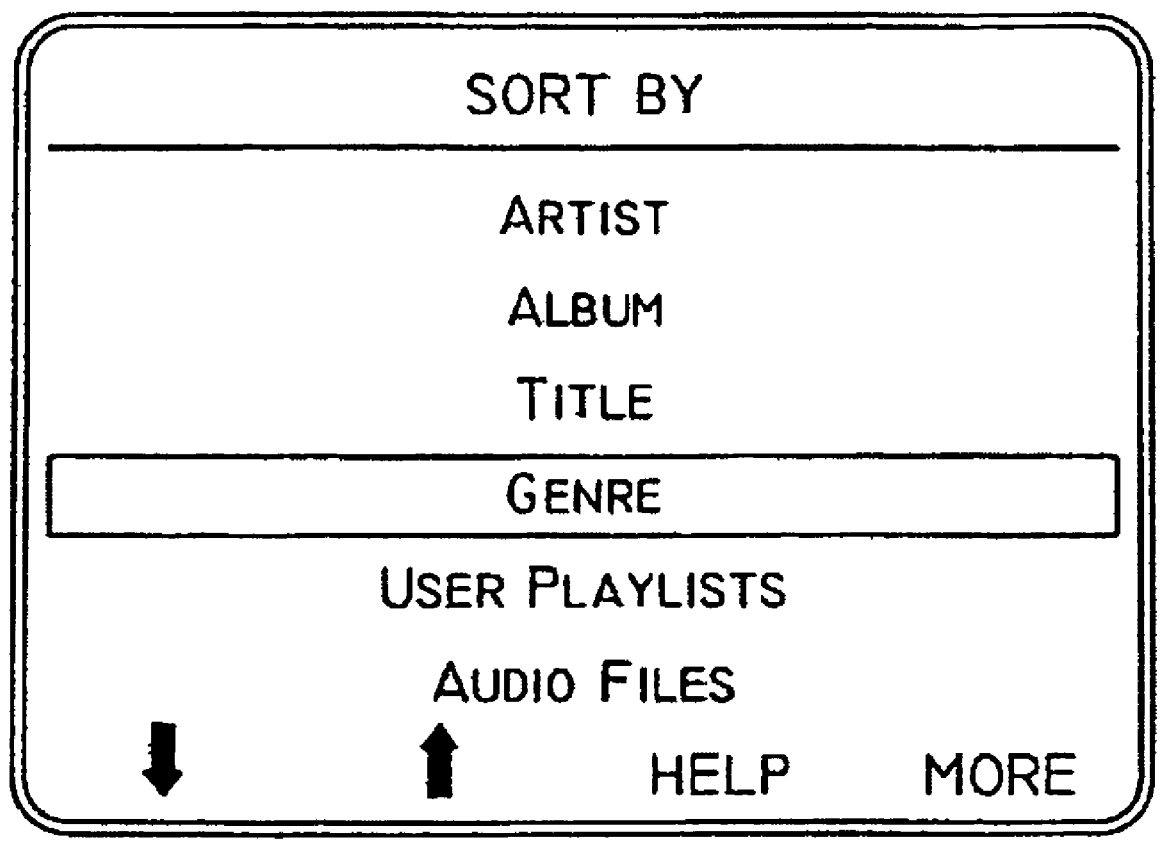
Fig. 5

METHOD AND APPARATUS FOR AUTOMATIC EQUALIZATION MODE ACTIVATION

This application claims the benefit, under 35 U.S.C. § 365 of International Application PCT/US021/20365, filed Jun. 28, 2002, which was published in accordance with PCT Article 21(2) on Mar. 20, 2003 in English and which claims the benefit of U.S. Provisional patent application No. 60/318,585, filed Sep. 11, 2001.

BACKGROUND OF THE INVENTION

The present invention relates to an apparatus and a method for processing digitally encoded audio data and features of related music management software.

The use of portable audio data players capable of playing digitally encoded audio data has become commonplace. In particular, relatively small handheld devices that can process digitally encoded audio data stored on solid state memory devices have become popular. Additionally, as demand has increased for higher data storage capacity in portable audio data players, another generation of players has been developed and is gaining popularity. These portable audio data players include miniaturized high capacity hard drives that are not as susceptible to skips and other similar problems as are typical hard drives used in personal computers ("PC") and other applications.

In an audio data player, the digital audio data is loaded into a data storage device by first downloading the data to a PC from an audio CD, the Internet, or another digital audio device. The data is then usually compressed according to a selected encoding format and loaded into the data storage device associated with the audio data player.

The audio data is decompressed/decoded by the audio data player during playback according to the selected encoding format. A variety of encoding formats for compressing and decompressing audio data is available. As used hereinafter, the term encoding format refers to any encoding/decoding scheme that specifies the syntax and semantics of a compressed bitstream and how the bitstream must be decompressed for reproduction. Such encoding formats include, but are not limited to, MP3 and MP3 Pro.

The data structure used for MP3 files includes a sequence of interleaved header frames and data frames. Each header frame includes various fields of information that pertain to the data frame that follows, for example, the bit rate used for compressing the data frame that follows. While the compression ratio used for encoding the audio data file may be fixed (constant bit rate or "CBR") or may vary frame to frame depending upon the complexity of the audio (variable bit rate or "VBR"), the amount of playback time represented by each frame remains the same for MP3 formatted files. Therefore, in a VBR file, the amount of data contained within each data frame will vary, thus presenting difficulties in displaying elapsed play time during playback, especially when forward or backward skipping during the playback of an audio data file. To solve this problem, audio data players generally develop a timekeeping map that must be precompiled prior to playback by reading all of the header frames of an audio data file. Unfortunately, the precompiling of a timekeeping map delays the commencement of playback once an audio data file is selected.

For MP3 encoded audio data files, the data file is prepended or appended with a special set of frames called an ID3 tag. The ID3 tag contains descriptive text and other data relevant to the audio data file. For example, the tag may include title, artist, album, year, comments, and genre. ID3 tag information is useful for searching, sorting, and selecting specific audio data files based on the information contained in the ID3 tag. Because ID3 tag information is often stored as textual characters, the information can be displayed on the display screen of an audio data player. Although such a user interface is useful for finding, selecting, and playing an individual audio data file, having to read the display can be distracting to a person using an audio data player while involved in an activity such as jogging or driving.

Most audio data players utilize a digital signal processor ("DSP") for performing audio decoding, decompression, and other transformations of the audio data file. For example, the DSP can provide various preset equalization modes or other audio enhancing settings that are useful for quickly selecting a specific playback preference. For example, a preset DSP mode may be specified for specific audio genres such as rock, jazz, and pop. Selection of such preset DSP modes generally requires the user to change the DSP mode during playback by pressing a designated button or selecting the DSP mode from a display menu. However, it may be inconvenient or difficult for the user to select or reselect a particular DSP mode during playback, for example, if the user is exercising, or if the player is operating in a random mode wherein the play may select a different genre each time a new file is selected for playback.

Most PC-based audio data file management programs allow the user to create and edit playlists that can then be downloaded to a portable audio data player and used for playing a select sequence of audio data files. One such form of playlist typically associated with MP3 audio data files is known as an M3U list. An M3U playlist consists simply of a text file containing a numbered sequential list of paths or locations of data audio files included in the playlist. Thus, a playlist created on a PC and downloaded to an audio data player may be used to selectively play a sequence of audio data files that are contained in the data storage of the audio data player. However, audio data players generally do not allow a playlist to be created or edited on the audio player itself. Additionally, the M3U file format includes only the file location or path information and a comment field. Thus, the M3U file format does not contain other audio data file information such as the information contained in an ID3 tag of an MP3 audio data file.

BRIEF SUMMARY OF THE INVENTION

The present invention addresses some of the above-noted limitations of audio data players, particularly handheld audio players, by providing an audio data player having a microcontroller coupled with data storage and an audio decoder for processing encoded audio data files which includes a sound equalizer with selectable equalization modes. In particular, the present invention provides an audio data player having preset sound equalization modes for specific music genres. The present invention also provides a method and apparatus for automatically selecting preset equalization modes.

The audio data player generally includes a microcontroller coupled with a user interface, data storage, buffer memory, and an audio decoder. The user interface includes an LCD and a keyboard having various multi-way and multi-function switches. The audio data player also provides a universal serial bus ("USB") port for connection to a PC or other USB-equipped device. By connecting the audio data player to a PC via the USB port, audio data files and audio playlists can be downloaded to the audio data player and stored into data storage. In one embodiment, the data storage comprises a 10 GB hard drive; however, other moving data storage media or solid state memory devices, such as flash memory cards, may also be used. In this embodiment, the user interface provides menu driven selection, sorting, and playback of audio data files. Additionally, during playback of an audio data file, the LCD displays ID3 tag information such as title, artist, album, and genre. The LCD screen may also display other information such as elapsed playback time, volume level, and preset DSP mode.

The audio data player includes a DSP comprising the audio decoder and the preset sound equalization modes. The equalization mode may be selected through the user interface or may be automatically set by the audio data player according to the music genre contained in the audio data file ID3 tag information. This feature provides equalization modes that are specifically configured for the music genre to enhance the audio reproduction of the audio data player.

The disclosed embodiment of the audio data player is a portable handheld unit having a rechargeable battery, 5 volt DC input, headphones output port, and line out port. Therefore, the audio data player can be used for portable applications using headphones, or for fixed applications using AC power and headphones or another audio device.

In one form thereof, an audio data player is disclosed comprising a microcontroller coupled with data storage device for storing audio data files and an audio decoder and is characterized by a sound equalizer having a plurality of selectable equalization modes, and software enabling the microcontroller to identify an attribute of an audio data file and to select one of the equalization modes based on the attribute.

In another form thereof, a method is disclosed for playing an audio data file in an audio data player, characterized by providing a sound equalizer having a plurality of selectable equalization modes, reading an attribute of an audio data file, and selecting an equalization mode based on the attribute.

In yet another form thereof, an audio data player is disclosed comprising a microcontroller coupled with data storage for storing audio data files having a genre identifying data field and a digital signal processor, characterized in that the digital signal processor has a plurality of selectable equalization modes, and the microcontroller selects one of the equalization modes based on the genre of one of the audio data files selected for playback.

Advantageously, the disclosed audio data player automatically sets the DSP equalization mode according to the audio data files ID3 tag information of an MP3 file, providing an improved playback quality. Additionally, if a specific DSP equalization mode is not available for the audio data file genre, the disclosed audio data player will automatically select a default digital signal processor equalization mode. Additionally, a user may manually override the automatic mode selection and select a different DSP equalization mode. Automatic selection of the DSP equalization mode is especially useful as a convenience feature when using an audio data player during activities such as running.

BRIEF DESCRIPTION OF THE DRAWINGS

The above mentioned and other features and objects of this invention, and the manner of attaining them, will become more apparent and the invention itself will be better understood by reference to the following description of one embodiment of the invention taken in conjunction with the accompanying drawings, wherein:

FIG. 3 is a back view of the portable audio data player of FIG. 2;

FIG. 4 is a right side view of the portable audio data player of FIG. 2;

FIG. 5 is a plan view of the main menu displayed on the audio data player of FIG. 2;

Figure 1:
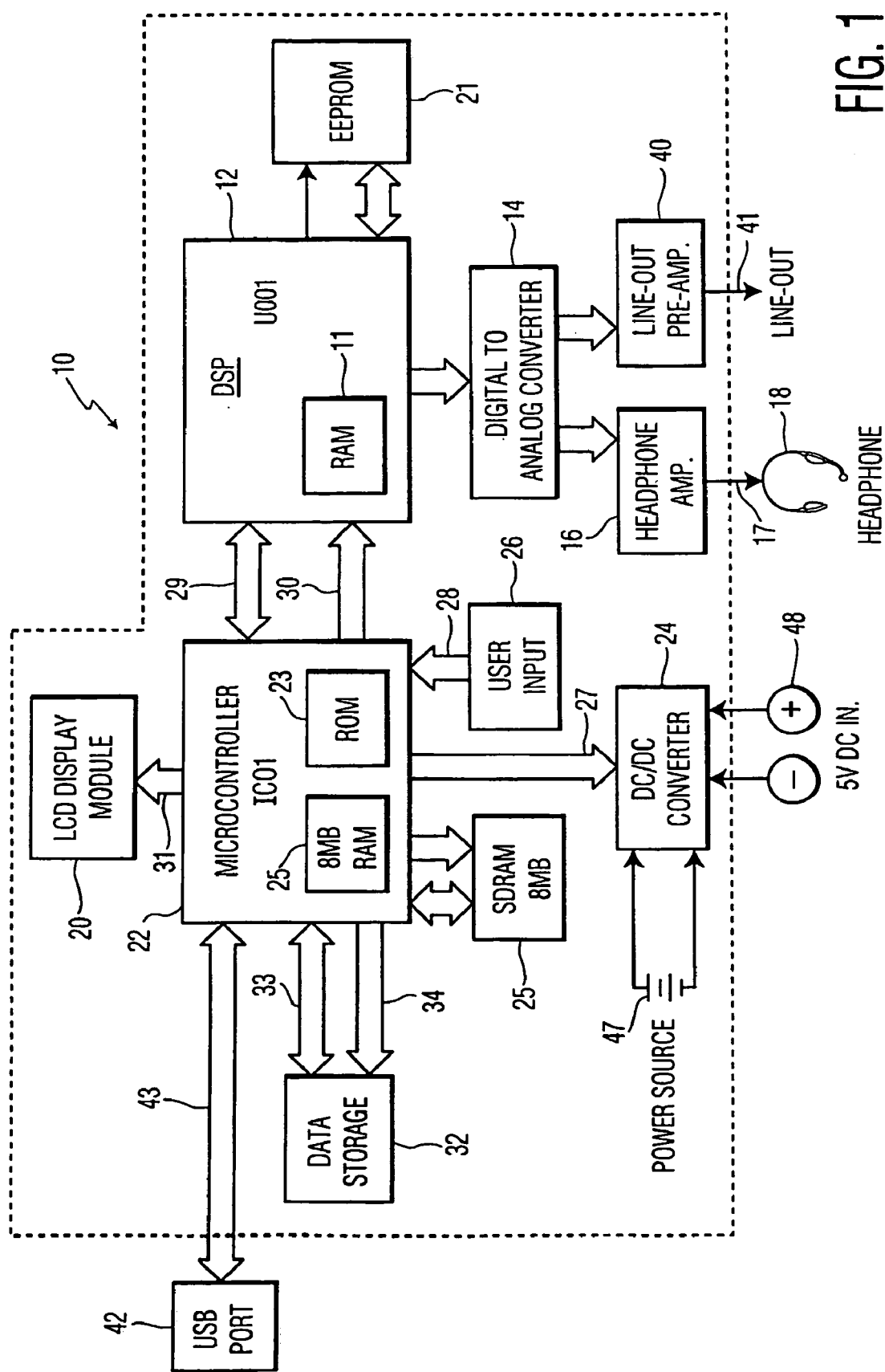
FIG. 1 is a block schematic diagram of a portable audio data player according to the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates one embodiment of the invention, in one form, and such exemplifications are not to be construed as limiting the scope of the invention in any manner.

DETAILED DESCRIPTION OF THE INVENTION

The embodiment disclosed below is not intended to be exhaustive or limit the invention to the precise form disclosed in the following detailed description. Rather, the embodiment is chosen and described so that others skilled in the art may utilize its teachings.

FIG. 1 shows a block diagram of portable audio data player 10 according to the present invention. The general arrangement and operation of the various elements are described hereinbelow. However, the details of the various elements of audio data player 10 are well known to those skilled in the art and will not be discussed in detail here. Audio data player 10 comprises microcontroller 22 that controls the various elements and the overall operation of audio data player 10, including transferring data from data storage 32, through buffer memory 25, and to audio decoder DSP 12. Microcontroller 22 includes a suitable amount of memory 23, for storing various instruction sets and programs for controlling the operation of audio data player 10.

DSP 12 may be programmed to perform a variety of signal processing functions during playback of a selected audio data file. In this case, the functions that DSP 12 performs during playback include, but are not limited to, decoding audio data files, volume control, digital sound equalization, and sample conversion. In that regard, DSP 12 includes onboard memory 11, wherein the decoder files, audio data files, equalizer mode selection, and various other required data are loaded during playback.

The decoder files comprise programs that control the decoding operations of DSP 12 and the audio data files include data associated with the audio content. Both the audio data files and the decoder files may be stored in data storage 32. The decoder file including the programs are transferred to DSP memory 11 from data storage 32. Alternatively, the decoder files may be stored in ROM 23, RAM 11 or other suitable storage device of player 10. Further, the decoder files and other system files and programs may also be stored in SDRAM 25, EEPROM 21 or other suitable storage devices coupled to DSP 12.

Audio data and decoder programs stored in data storage 32 may be encrypted, requiring that decoding program files and audio data files be decrypted by DSP 12 using one or more decryption keys. The decryption keys may also be stored in data storage 32 and may be security linked to the particular storage device or some other coded component of audio data player 10 so that audio data files encrypted for use on a particular audio data player may only be decrypted and played by that particular audio data player.

As a selected audio data file is decoded, DSP 12 provides the decoded data stream to digital to analog converter 14. D/A converter 14 converts the digital output of DSP 12 into an analog signal and provides the analog signal to headphones amplifier 16 and lineout pre-amp 40. The analog signals are amplified and provided to lineout jack 41 and headphones jack 17, both disposed on housing 13 of audio player 10.

DSP 12 may include a plurality of selectable preset equalization modes, for example, bass, jazz, pop, rock, and flat. Each of these selectable equalization modes is specifically configured to enhance the audio reproduction of the type of audio information, such as the genre of music or type of speaking that is encoded in the audio data. Additionally, the exemplary embodiment includes automatic selection of the DSP equalization mode and further allows the user to manually set the sound equalization via a graphic equalizer user interface displayed on display 21 by LCD display module 20. Alternatively, player 10 may advantageously include a single IC that incorporates the functions of microcontroller 22 and DSP 12 into one unit. An IC suitable for such purpose includes, but is not limited to, TMS320DA250 manufactured by Texas Instruments, Inc. Such an IC can be configured to decode and processes the MP3 files in the known manner, and also programmed to provide the automatic DSP selection feature described below.

Audio player 10 is adapted to operate with data storage 32. In this embodiment, data storage 32 is a moving data storage device, specifically a hard drive, that can be used to store various data files, including encoded audio data files, decoder files for controlling the decoding operation of DSP 12, playlist files, and computer data files, such as, for example, word processing files, presentations, and spreadsheets. A large amount of data can be readily transferred between data storage 32 and microcontroller 22 through data bus 33. Buffer memory 25 operates as a circular data buffer to prevent interruption of audio playback caused by a skip or other similar moving data storage device data transfer delays. Using the present invention, decoder files, playlists, and relatively large amounts of audio data can be stored on data storage 32.

In accordance with the disclosed embodiment of the present invention, audio data files are loaded into data storage 32 via USB port 42 from a PC, or other similar device, using music management software that encodes the audio data files in accordance with a selected encoding format, such as MP3, or MP3 Pro, and then stores the encoded data files. Such music management software is implemented using programming methods known in the art. The music management software transmits the audio data files and appropriate decoder files to audio data player 10 across data buses 43 and 33 and into data storage 32. The music management software also generates, and modifies as necessary, a system configuration file and a file attribute table to provide information regarding the various data files and decoder files stored in data storage 32. Using the configuration file and the file attributes table, audio data player 10 is able to display audio data files sorted by various groupings on display 21, determine the correct encoding format for each audio data file, and download the appropriate decoder file for each content file in response to a user selection.

Figure 2:
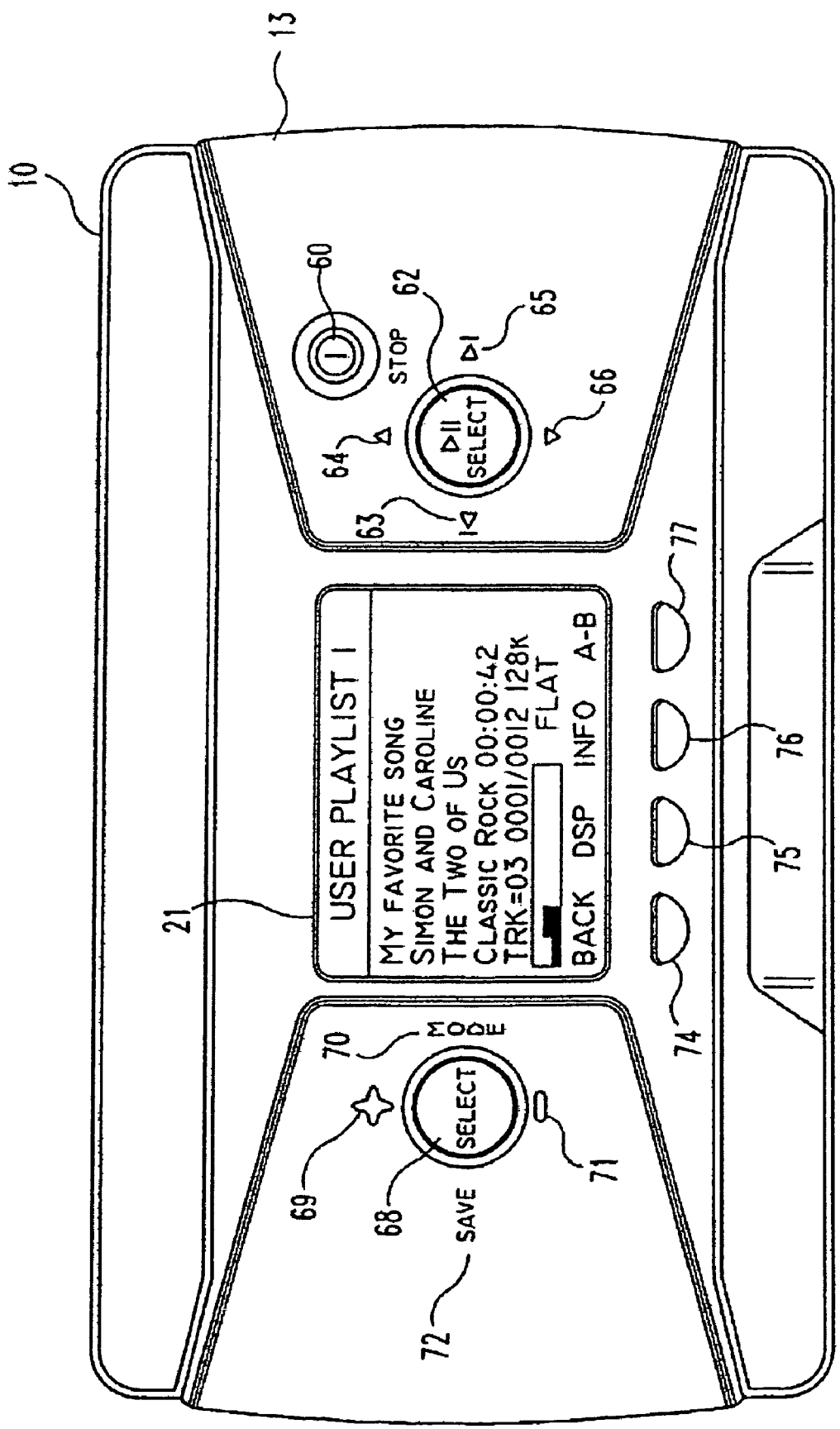
FIG. 2 is a top view of a portable audio data player according to the present invention.

FIGS. 2-4 illustrate an exemplary embodiment of the displays, buttons, switches, indicators, and ports which may be disposed on housing 13 of audio data player 10. Referring to FIG. 2, user input 26 comprises a plurality of buttons 44 (FIG. 3), 46 (FIG. 4), and 60-77 disposed on housing 13 of audio data player 10 for allowing a user to sort and select particular audio data files for playback, and to control playback settings. User input 26 may also comprise other input devices known in the art, for example, keyboard, voice activated touch pad, and touch screen input devices. Two multi-way switches comprise buttons 62-66 and 68-72. Soft keys 74-77 are multi-function buttons whose function change for various user interface menu displays. Audio data player 10 also includes display 21 disposed on housing 13. Display 21 displays the audio data files and playlists stored in data storage 32, the function of soft keys 74-77, and various status information associated with audio data player 10, such as the playback status shown in FIG. 2 and the top-level menu shown in FIG. 5.

Referring again to FIG. 2, STOP/POWER button 60 allows the user to stop playback and to turn audio data player 10 on and off. PLAY/PAUSE button 62 allows the user to start playback and to pause playback. Left arrow button 63 allows a user to move a highlight left when using the menu, and to skip back to the previous audio data file or scan backward in the present audio data file when playing music. The right arrow button 65 allows the user to move a highlight right when using the menu, skip forward to the next audio data file, and scan forward in the current audio data file when playing music. Up arrow button 64 allows the user to move the highlight up when using the menu. Down arrow button 66 allows the user to move the highlight down when using the menu.

Referring still to FIG. 2, SELECT button 68 allows the user to select a highlighted item. Volume up button 69 increases the playback volume level for headphones 18 and volume down button 71 decreases the volume level. MODE button 70 allows the user to select a particular playback mode, including NORMAL, REPEAT, REPEAT ONE, REPEAT ALL, SHUFFLE, and REPEAT ALL SHUFFLE. SAVE button 72 allows a user to create a new playlist or add audio data files to an existing playlist. Soft keys 74-77 select the menu item that appears just above each button at the bottom of display 21.

Referring to FIG. 3, POWER indicator 78 lights when audio data player 10 is on. CHARGE indicator 79 lights when the power source 47 is charging. In the exemplary embodiment, power source 47 is a rechargeable battery pack. DC IN jack 48 provides 5 volt DC from an AC adapter to power audio data player 10 and recharge power source 47. RESET button 44 allows the user to reset all of the audio data player settings to the factory defaults.

Referring now to FIG. 4, OFF/LOCK switch 46 allows the user to make buttons 60-77 inactive when switch 46 is slid to the locked position. LINE OUT jack 41 allows a user to connect the audio data player to a separate audio system. Headphones jack 17 allows the user to play the decoded audio on headphones 18. USB port 42 provides connection of audio data player 10 to a PC or other similar device using a USB cable.

When the user selects a particular audio data file for playback via user input, microcontroller 22 loads the appropriate decoder file associated with the selected audio data file from data storage 32 into DSP memory 11. Referring again to FIG. 1, microcontroller 22 then streams the selected audio data file along buses 33 and 29 into DSP 12, using buffer memory 25 as a skip-protection buffer.

After streaming of the selected audio data file begins, DSP 12 decodes the audio data file using the associated decoder file. The decoder files stored in data storage 32 allow audio player 10 to be adapted to process the various encoding formats associated with the audio data files stored in data storage

32. In effect, portable audio player 10 is software upgraded, as necessary, by the decoder files stored in data storage 32 when the user selects a particular audio data file stored in data storage 32. The steps associated with processing a selected audio data file from data storage 32 using audio data player 10 is shown in the flowchart of FIG. 6, and described below.

Figure 6:
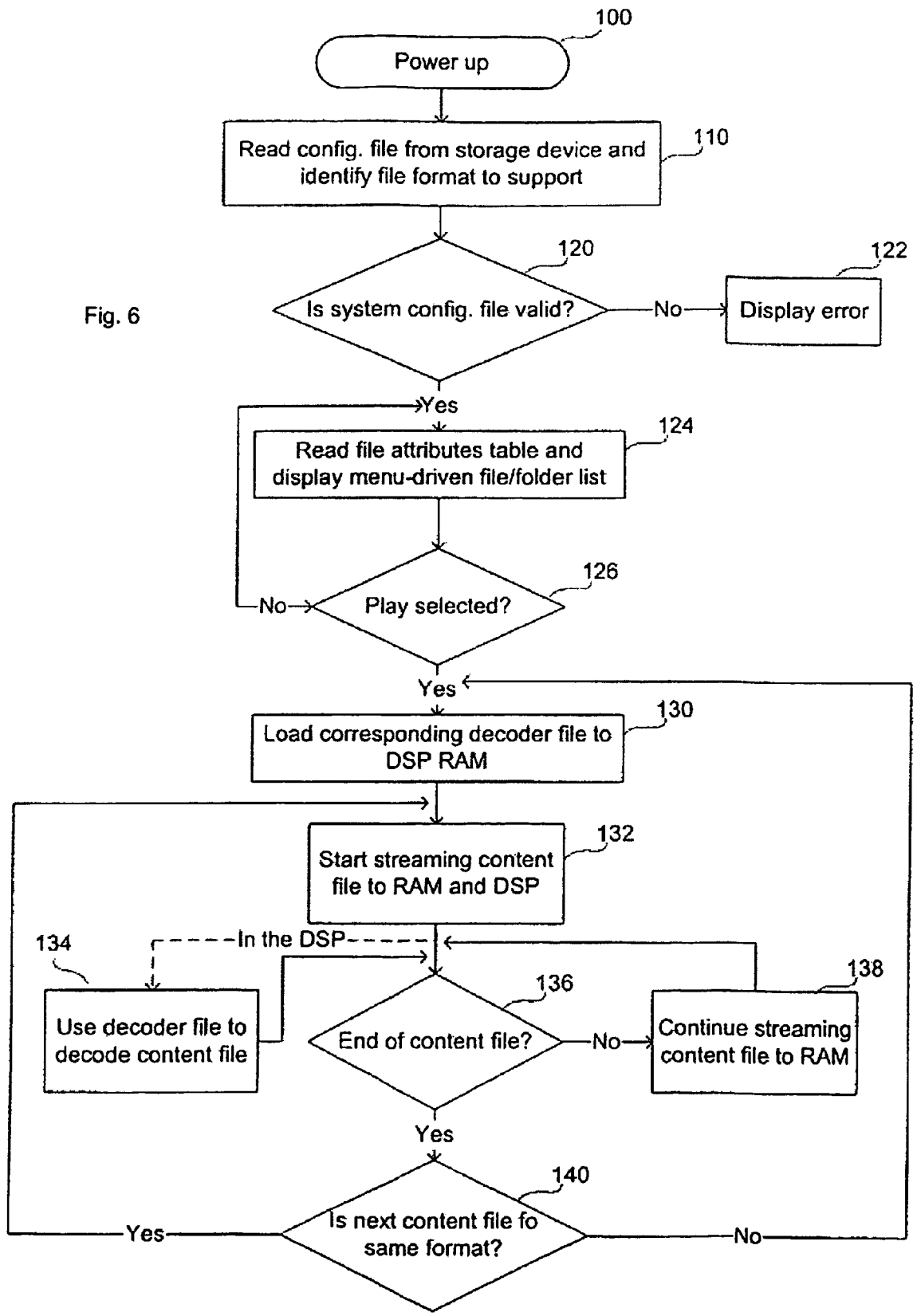
FIG. 6 is a flowchart diagram illustrating the steps for playing back an audio track using a portable audio data player according to the present invention.

FIG. 6 shows a flowchart illustrating the steps for processing a selected audio data file in accordance with the present invention. After powering up in step 100, microcontroller 22 of audio data player 10 loads the system configuration file from data storage 32, in step 110. Also in step 110, microcontroller 22 identifies the various file formats that need to be supported for the data files stored in data storage 32. The configuration file also includes information that equates the file extension of the audio data files with particular decoder files stored in data storage 32. In step 120, if a configuration file is not valid, microcontroller 22 causes an error indication to be displayed, step 122, on display 21. In step 124, if the configuration file is valid, microcontroller 22 reads the file attribute table stored in data storage 32 and causes display 21 to display a menu-driven listing of the file/folders stored in data storage 32.

Referring to FIG. 5, the main menu displayed on display 21 allows the user to navigate and display audio data files according to groupings or identifying characteristics, such as, for example, artist, album, title, genre, playlist, and all audio data files. From the main menu, the user may operate user input 26, as described above, to navigate sorted lists and select a desired one of the displayed audio data files or playlists for playback.

When an audio data file or playlist is selected for playback in step 126, microcontroller 22 and DSP 12 perform a number of steps, including several concurrent steps, to provide audio playback. First, microcontroller 22 identifies and transfers the corresponding decoder file from data storage 32 to DSP memory 11 in step 130. For example, if the user selects an MP3 file, microcontroller 22 transfers the MP3 decoder file from data storage 32 to DSP memory 11. The MP3 decoder file is used to control the decoding operation of DSP 12.

In step 132, microcontroller 22 begins streaming the selected audio data file from data storage 32 through buffer memory 25 to DSP 12. In step 134, DSP 12 uses the decoder file to decode and decrypt, if applicable, the audio data file in accordance with the appropriate encoding format. The decoded audio data is provided to D/A converter 14 and headphone amp 16 and line out pre amp 40 for reproduction.

In step 136, it is determined whether all of the data in the selected audio data file has been transferred to buffer memory 25. If not, in step 138, microcontroller 22 continues to stream data from data storage 32 to buffer memory 25. If the transfer of data is complete as determined in step 136, microcontroller 22 determines in step 140 whether the next audio data file is encoded using the same format as the previous audio data file. If the encoding format of the next audio data file is the same as the previous encoding format, microcontroller 22 returns to step 132 and starts streaming the data from the next audio data file, which data is subsequently decoded in step 134 as before.

If the encoding format of the next audio data file differs from the encoding format of the previous audio data file, microcontroller 22 returns to step 130. In this case, a new decoder file associated with the next audio data file is transferred to DSP memory 11, and the steps of streaming the audio data file and decoding the data file using the newly loaded decoder file is repeated. In this manner, audio data player 10 is able to playback audio data files encoded using any one of a plurality of encoding formats, as long as the decoder file associated with the selected encoding format is available and can be downloaded onto DSP memory 11. In the present embodiment, the necessary decoder files are stored in data storage 32 along with the audio data files. As such, audio player 10 can be updated to play different encoding formats by software updating of the DSP via decoder files stored along with the audio data files in data storage 32. Thus, audio data player 10 is capable of playing back data files encoded using a variety of encoding formats, including encoding formats that become available in the future.

In the exemplary embodiment, DSP 12 also functions as a digital sound equalizer. DSP 12 equalization may comprise preset equalization modes, for example, BASS, JAZZ, POP, ROCK, AND FLAT. The user may set a preferred one of the DSP modes via user input 26. Specifically, as shown in FIG. 2, pressing soft key 75 will display a DSP menu on display 21 from which the user may select a preferred DSP mode. Additionally, the user may select a graphic equalizer display for graphically and manually setting the sound equalization for DSP 12.

The exemplary embodiment also allows a user to specify that audio data player 10 automatically select the DSP mode for each audio data file. When preparing to play an audio data file, microcontroller 22 can identify an attribute of the audio data file selected for playback. For example, for an MP3 file, microcontroller 22 reads the ID3 tag information field specifying the genre of the audio data file. Using control bus 30, shown in FIG. 1, microcontroller 22 then sets the DSP equalization mode according to the genre of the audio data file. Memory 23 may include a table that correlates various genres to respective DSP equalization modes, wherein the genre of the selected audio file is compared to the table, or map, to select the appropriate equalization mode. If a compatible mode is not available, microcontroller 22 sets the default DSP equalization mode, such as flat.

Figure 7:
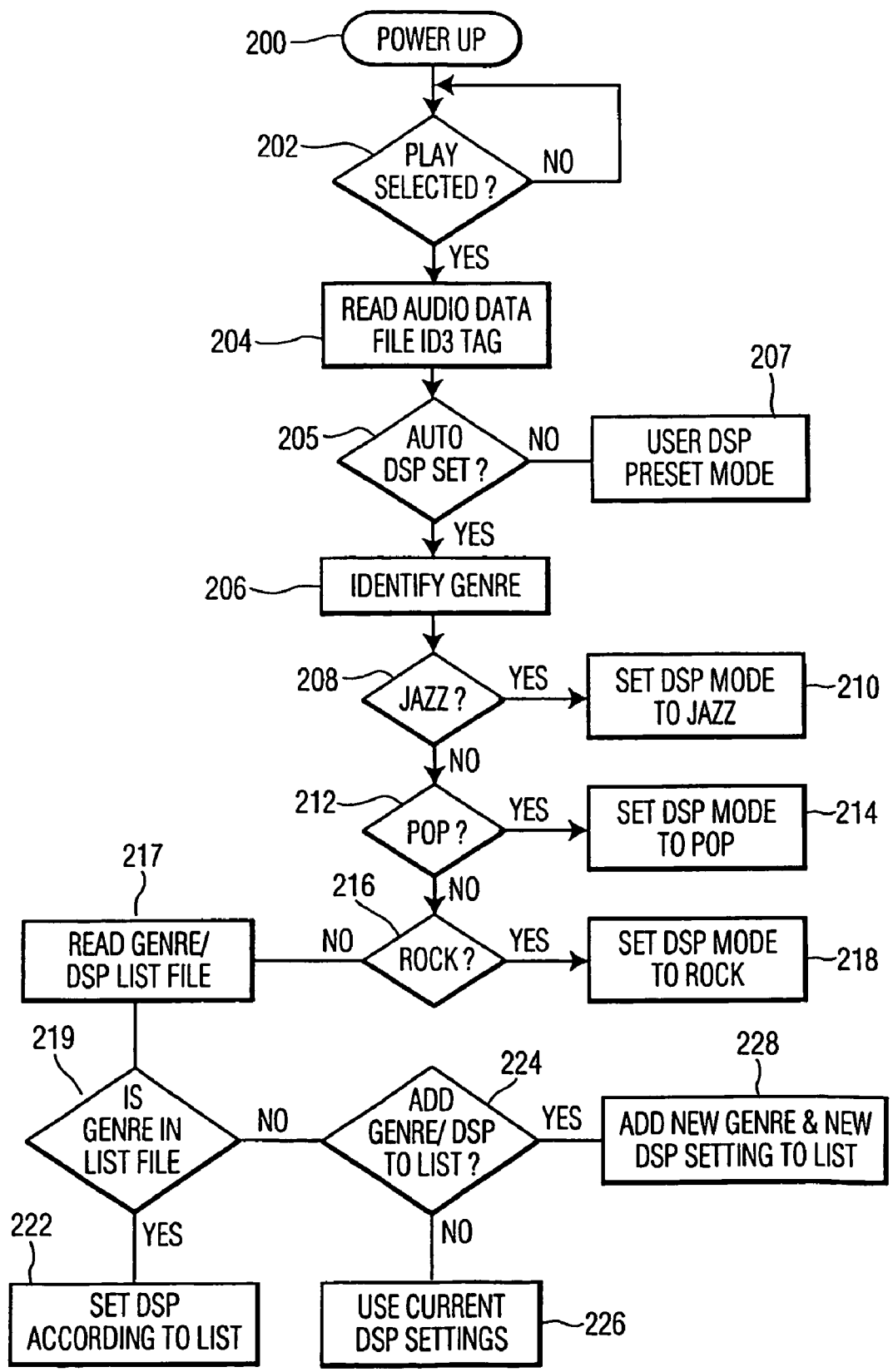
FIG. 7 is a flowchart diagram illustrating the steps for automatically setting the DSP equalization mode.

Referring to FIG. 7, a flowchart showing the process for automatically selecting a DSP equalization mode is shown. The process beginning in step 200 may operate concurrently with the process shown in FIG. 6. In step 202, it is determined whether play of an audio data file is selected. If play is selected, in step 204, microcontroller 22 reads the ID3 tag of the audio data file selected for playback. In step 205, player 10 determines whether the auto DSP mode is set. If not, player 10 begins playback using the current DSP mode, or a default DSP mode. If the auto DSP mode is set, player 10 continues to step 206, wherein microcontroller 22 identifies the music genre of the audio data file from the appropriate ID3 tag information field. Steps 208 through 218 set the DSP 12 equalization mode corresponding to the identified genre of the audio data file. Specifically, step 208 determines whether the genre is jazz. If so, step 210 sets DSP 12 to JAZZ. If the identified genre is not jazz, step 212 determines whether the identified genre is pop. If so, step 214 sets DSP 12 to POP. If the identified genre is not pop, step 216 determines whether the identified genre is rock. If so, step 218 sets DSP 12 to ROCK. In this manner, the identified genre is compared to the list of genres and corresponding DSP modes that is stored in a genre/DSP mode list, table, or map that is stored in a memory device, and the corresponding DSP mode, if any, is identified and automatically set.

Additional steps may be included in the process of FIG. 7 for further preset genre specific equalization modes, for example, such as those supported by various ID3 standards. If the operation of steps 208 through 218 fail to match a preset mode with the identified genre of the audio data file, player 10 determines whether a new genre/DSP setting has been created by the user and if an appropriate setting exists automatically selects that setting. In step 217, the player reads the genre/DSP list file and in step 218 determines whether the genre is in the list file. If so, player 10 sets the DSP mode according to the genre setting in the list file. If not, player 10 determines whether the user wishes to add the genre to the list and designate a DSP mode to the newly added genre. The prompt may be provided using a display on LCD display module 20 and allow the user to select a mode using the controls described above. In step 228, if the user indicates a DSP mode to be associated with the genre and that the correlation is to be saved, player 10 modifies the genre/DSP list file to include the new listing and begins playback using the selected DSP mode. If the user does not select a DSP mode and indicate that the DSP mode should be saved, player 10 begins playback using the currently selected, or a default, DSP mode.

Although the exemplary embodiment provides automatic selection of the DSP equalization mode based on the genre of the audio file, any attribute of the audio data file, whether part of the ID3 tag information or the audio data itself, may be used to select the DSP equalization mode. For example, the user may set a particular DSP mode for a particular artist as identified in the ID3 tag, such that for all other audio files associated with that particular artist results in the automatic selection of the selected equalization mode. Furthermore, the desired equalization mode may be entered into the ID3 tag during the encoding process or after the audio file is stored in player 10. In such a case, the player automatically recognizes the desired equalization mode indicated in the ID3 tag and sets the equalization mode accordingly. Also, the desired equalization mode may be selected based on a particular category of attribute information stored in the ID3 tag. As is known, the ID3 tag of an MP3 file may include several types of attribute information, such as genre, artist, etc. In an alternative embodiment, player 10 allows the user to select the category of attribute information that is used to set the equalization mode, wherein in such a mode player 10 reads the selected attribute information from the user selected category, compares the selected attribute information to a table, or mapping, of equalization modes, and selects the desired equalization mode accordingly. For example, the user may select a mode wherein player 10 automatically selects the DSP mode based on the artist, or another selected identifying attribute, information included in the ID3 tag portion.

During playback, the display, shown in FIG. 2, displays various information about the audio data file and the audio data player settings. For example, display 21 in FIG. 2 shows the file name, artist name, album title, genre, current track being played out of total files being played, volume level indication, elapsed play time of audio data file, playback mode indication, bit rate, and selected DSP mode selection.

In the exemplary embodiment, suitable microcontrollers 22 include, but are not limited to, µPC78A4036 manufactured by NEC Corporation. Associated with microcontroller 22 is memory 23, in this case, 48 KB of ROM, and buffer memory 25 comprising 8 MB of RAM, providing 7 minutes of buffered play time at 128 kbps and 14 minutes of buffered play time at 64 kbps. Suitable DSP units 12 include, but are not limited to, TMS320NC5410manufactured by Texas Instruments, Inc., of Dallas, Tex. DSP 12 also includes associated memory 11, in this case 64 KB of RAM. Suitable hard drives for data storage 32 include, but are not limited to, Microdrive™ manufactured by IBM Corporation of Armonk, N.Y. A 10 GB hard drive, for example, provides approximately 150 hours of audio at MP3 bit-rate of 128 kbps, or 300 hours at a bit-rate of 64 kbps.

It will be apparent to those skilled in the art that although the present invention has been described in terms of an exemplary embodiment, modifications and changes may be made to the disclosed embodiment without departing from the essence of the invention. For example, although the present invention has been described with reference to data storage 32 that is fixedly disposed within audio player 10, the present invention may be implemented using flash memory, another fixed storage device, optical device, or a memory card that is adapted to be coupled, either detachably or fixedly, to audio player 10, wherein the decoder program and audio data files are loaded onto the memory card by the music management software. Also, although the present player includes separate microcontroller, DSP for decoding the audio files, and D/A converters, it is recognized that various functions of these elements may be implemented with a single element, or various other combination of elements. Also, it is herein recognized that the present feature of loading the appropriate decoder programs and the audio data files may be implemented in the music management software using any one of a number of conventionally known programming methods, or combination of programming methods. Also, the automatic DSP equalization mode selection feature may be implemented independently of the manner in which the decoder file and the audio files are stored and streamed to the DSP during playback. Also, although the above is described in reference to an audio data player, the present invention may be extended to any portable data processing device, for example, video display devices, wherein the data may be encoded using one of a plurality of data encoding formats. Therefore, it is to be understood that the present invention is intended to cover all modifications as defined in the appended claims.

The invention claimed is:

1. An audio data player, comprising:

a data storage device for storing a plurality of encoded audio data files, the encoded audio data files including at least one preset genre category and at least one user created genre category, wherein each said preset genre category includes a corresponding preset equalization setting and each said user created genre category includes a corresponding user created equalization setting;

a signal processing unit for receiving a selected one of the encoded audio data files, decoding the selected audio data file and providing an output signal;

a user input device for accepting user inputs; and a microcontroller, coupled to the data storage device, the signal processing unit and the user input device, for controlling the operation of the data storage device and the signal processing unit in response to the user inputs;

wherein the signal processing unit provides a sound equalizer having a plurality of selectable equalization settings, and the signal processing unit is adapted to identify one of the preset genre category and the user created genre category associated with the selected audio data file, and to automatically select one of the corresponding preset equalization setting and the corresponding user created equalization setting in response to the identification.

2. The audio data player of claim 1, wherein the encoded audio data files correspond to MP3 formatted files.

3. The audio data player of claim 2, wherein each said preset genre category is one of a jazz category, a pop category and a rock category.

4. The audio data player of claim 2, wherein information representing the preset genre category is stored in an ID3 tag.

5. The audio data player of claim 2, wherein the data storage device comprises a map for correlating each said preset genre category with its corresponding preset equalization setting, and for correlating each said user created genre category with its corresponding user created equalization setting.

6. A method for processing an audio data file, comprising the steps of:
 providing a data storage device for storing a plurality of encoded audio data files, the encoded audio data files including at least one preset genre category and at least one user created genre category, wherein each said preset genre category includes a corresponding preset equalization setting and each said user created genre category includes a corresponding user created equalization setting;
 providing an interface for enabling the user to select one of a plurality of encoded audio data files for playback;
 identifying one of the preset genre category and the user created genre category associated with the selected audio data file; and
 automatically selecting one of the corresponding preset equalization setting and the corresponding user created equalization setting in response to the identification.

7. The method of claim 6, wherein the plurality of audio data files include MP3 files.

8. The method of claim 7, wherein each said preset genre category is one of a jazz category, a pop category and a rock category.

9. The method of claim 7, wherein information representing the preset genre category is stored in an ID3 tag.

10. The method of claim 7, wherein the data storage device comprises a map for correlating each said preset genre category with its corresponding preset equalization setting, and for correlating each said user created genre category with its corresponding user created equalization setting.

11. An audio data player, comprising:
 a data storage device for storing a plurality of encoded audio data files, the encoded audio data files including at least one preset genre category and at least one user created genre category, wherein each said preset genre category includes a corresponding preset equalization setting and each said user created genre category includes a corresponding user created equalization setting;
 a signal processing unit for processing a selected one of the encoded audio data files and providing an output signal; and
 wherein the signal processing unit provides a sound equalizer having a plurality of selectable equalization settings, and the signal processing unit is adapted to identify one of the preset genre category and the user created genre category associated with the selected audio data file, and to automatically select one of the corresponding preset equalization setting and the corresponding user created equalization setting in response to the identification.

12. The audio data player of claim 11, wherein the encoded audio data files correspond to MP3 formatted files.

13. The audio data player of claim 11, wherein each said preset genre category is one of a jazz category, a pop category and a rock category.

14. The audio data player of claim 11, wherein information representing the preset genre category is stored in an ID3 tag.

15. The audio data player of claim 11, wherein the data storage device comprises a map for correlating each said preset genre category with its corresponding preset equalization setting, and for correlating each said user created genre category with its corresponding user created equalization setting.

* * * * *